US009450505B2

(12) United States Patent
Siessegger et al.

(10) Patent No.: US 9,450,505 B2
(45) Date of Patent: Sep. 20, 2016

(54) OPTOELECTRONIC COMPONENT DEVICE

(71) Applicant: OSRAM GmbH, Munich (DE)

(72) Inventors: Bernhard Siessegger, Danvers, MA (US); Hubert Maiwald, Neutraubling (DE); Marijan Kostrun, Newbury, MA (US); Philip E. Moskowitz, Georgetown, MA (US); Warren P. Moskowitz, Ipswich, MA (US); Norwin von Malm, Thumhausen/Nittendorf (DE)

(73) Assignee: OSRAM GMBH, Munich (DE)

( * ) Notice: Subject to any disclaimer, the term of this patent is extended or adjusted under 35 U.S.C. 154(b) by 106 days.

(21) Appl. No.: 14/373,039

(22) PCT Filed: Jan. 18, 2013

(86) PCT No.: PCT/EP2013/050990
§ 371 (c)(1),
(2) Date: Jul. 18, 2014

(87) PCT Pub. No.: WO2013/107894
PCT Pub. Date: Jul. 25, 2013

(65) Prior Publication Data
US 2015/0137701 A1    May 21, 2015

Related U.S. Application Data

(60) Provisional application No. 61/588,838, filed on Jan. 20, 2012.

(51) Int. Cl.
*H05B 37/02*      (2006.01)
*H02M 7/06*       (2006.01)
(Continued)

(52) U.S. Cl.
CPC .............. *H02M 7/06* (2013.01); *H01L 25/167* (2013.01); *H01L 27/156* (2013.01); *H01L 33/62* (2013.01);
(Continued)

(58) Field of Classification Search
CPC ............................... H05B 33/08; H05B 37/02
USPC ............ 315/185 R, 186, 192, 193, 291, 294, 315/306, 312
See application file for complete search history.

(56) References Cited

U.S. PATENT DOCUMENTS 7,986,107 B2 * 7/2011 Weaver .............. H05B 33/0812
315/121
8,164,276 B2 * 4/2012 Kuwabara ............ H05B 33/083
315/185 R
(Continued)

FOREIGN PATENT DOCUMENTS

CN          101257750 A      9/2008
WO          2011045372 A1    4/2011
(Continued)

OTHER PUBLICATIONS

International Search Report of PCT/EP2013/050990 mailed on Jun. 6, 2013.
(Continued)

*Primary Examiner* — Tung X Le
(74) *Attorney, Agent, or Firm* — Viering, Jentschura & Partner mbB

(57) ABSTRACT

An optoelectronic component device includes a first group of optoelectronic components including at least one first optoelectronic component, wherein the at least one first optoelectronic component provides electromagnetic radiation of a first color valence, a second group of optoelectronic components including at least one second optoelectronic component, wherein the at least one second optoelectronic component provides electromagnetic radiation of a second color valence, and a phase dimmer, wherein the phase dimmer is designed in such a way that a first operating mode and a second operating mode are provided, wherein the phase dimmer actuates the first and the second group of optoelectronic components in such a way that, in the first operating mode, a first array of optoelectronic components of the optoelectronic component device is energized and, in the second operating mode, a second array of optoelectronic components of the optoelectronic component device is energized.

15 Claims, 8 Drawing Sheets

(51) Int. Cl.
  H05B 33/08    (2006.01)
  H01L 25/16    (2006.01)
  H05B 41/39    (2006.01)
  H01L 27/15    (2006.01)
  H01L 33/62    (2010.01)
  H01L 25/075   (2006.01)
  G01R 31/26    (2014.01)
  G01R 31/40    (2014.01)
  G01R 31/44    (2006.01)
  G01R 31/02    (2006.01)

(52) U.S. Cl.
  CPC ........ *H05B 33/0803* (2013.01); *H05B 33/083* (2013.01); *H05B 33/086* (2013.01); *H05B 33/0806* (2013.01); *H05B 33/0812* (2013.01); *H05B 33/0815* (2013.01); *H05B 33/0821* (2013.01); *H05B 33/0827* (2013.01); *H05B 33/0845* (2013.01); *H05B 33/0848* (2013.01); *H05B 33/0851* (2013.01); *H05B 33/0884* (2013.01); *H05B 33/0893* (2013.01); *H05B 37/02* (2013.01); *H05B 37/0209* (2013.01); *H05B 41/39* (2013.01); *G01R 31/028* (2013.01); *G01R 31/2633* (2013.01); *G01R 31/2635* (2013.01); *G01R 31/40* (2013.01); *G01R 31/44* (2013.01); *H01L 25/0753* (2013.01); *H01L 2224/48091* (2013.01); *H01L 2224/48227* (2013.01); *H01L 2224/48247* (2013.01); *H01L 2924/12032* (2013.01); *H01L 2924/12044* (2013.01); *H01L 2924/1301* (2013.01); *H01L 2924/1305* (2013.01); *H01L 2924/13033* (2013.01); *H01L 2924/13091* (2013.01); *Y02B 20/343* (2013.01); *Y02B 20/345* (2013.01); *Y02B 20/346* (2013.01); *Y02B 20/347* (2013.01); *Y10T 307/615* (2015.04)

(56) References Cited

U.S. PATENT DOCUMENTS

| | | | | |
|---|---|---|---|---|
| 8,686,651 | B2* | 4/2014 | Lynch | H05B 33/0818 315/192 |
| 8,872,445 | B2* | 10/2014 | Egawa | H05B 33/0827 315/200 R |
| 2006/0244396 | A1* | 11/2006 | Bucur | H05B 33/083 315/312 |
| 2007/0267984 | A1 | 11/2007 | Peng | |
| 2008/0203936 | A1 | 8/2008 | Mariyama et al. | |
| 2010/0134018 | A1* | 6/2010 | Tziony | H05B 33/083 315/122 |
| 2011/0095703 | A1* | 4/2011 | Wilson | H05B 33/0863 315/294 |
| 2011/0260633 | A1 | 10/2011 | Takeda et al. | |
| 2012/0056559 | A1* | 3/2012 | Fu | H05B 33/083 315/297 |
| 2012/0091907 | A1 | 4/2012 | Setomoto et al. | |

FOREIGN PATENT DOCUMENTS

| | | |
|---|---|---|
| WO | 2011093395 A1 | 8/2011 |
| WO | 2011148590 A1 | 12/2011 |

OTHER PUBLICATIONS

Chinese Office Action based on Application No. 201380006072.0(8 Pages and 7 pages of English translation) dated Nov. 24, 2015.

* cited by examiner

FIG 1

|  | 45° | 90° | 135° |  |
|---|---|---|---|---|
| Cluster 1 | 350 | 200 | 95 | lm |
| Cluster 2 | 200 | 90 | 40 | lm |
| Cluster 3 | 120 | 20 | 0 | lm |
| Sum | 670 | 310 | 135 | lm |

|  | 45° | 90° | 135° |  |
|---|---|---|---|---|
| Cluster 1 | 52.2 | 64.5 | 70.4 | % |
| Cluster 2 | 29.9 | 29.0 | 29.6 | % |
| Cluster 3 | 17.9 | 6.5 | 0.0 | % |
| Sum | 100.0 | 100.0 | 100.0 | % |

OPTOELECTRONIC COMPONENT DEVICE

RELATED APPLICATIONS

The present application is a national stage entry according to 35 U.S.C. §371 of PCT application No.: PCT/EP2013/050990 filed on Jan. 18, 2013, which claims priority from U.S. application No. 61/588,838 filed on Jan. 20, 2012, and is incorporated herein by reference in its entirety.

TECHNICAL FIELD

An optoelectronic component device is provided in various embodiments.

BACKGROUND

When dimming the luminous intensity of a light-emitting means, for example of a conventional incandescent lamp, a redshift can often be perceived and be desirable. The redshift is formed owing to a change in the temperature of a metallic wire through which electric current is flowing from a high temperature value to a low temperature value. In the case of incandescent lamps, this is technically absolutely the case.

In the case of light-emitting diodes, for example white light-emitting diodes, a constantly high color temperature can have an irritating effect at a low luminous intensity or in the case of low levels of dimming. In the case of light-emitting diodes (LEDs), variable color temperatures are conventionally realized with different, sometimes very technically complex and cost-intensive mixing methods.

In a conventional method, the color locus of a light-emitting diode can be set for example, by means of the current intensity through the LED and/or the ON time of the LED (pulse width).

In a further conventional method, the color locus of an LED light can be set, for example, by means of different LED chains, wherein the LED chains can have one or more identical or different LED chips. In this case, the light from at least one first LED chain and one second LED chain of different color temperature is mixed in a diffuser.

The first LED chain has a higher color temperature than the second LED chain. For dimming of the LED light, the current through the first LED chain is reduced, while at the same time the current through the second LED chain is increased. In the case of intense dimming, the current through the LED chain with a low color temperature is then reduced again, i.e. the current through both LED chains is low.

The maximum current intensity through the LED chains is not present at the same time, i.e. the LED light could emit light with a higher light intensity than is actually taking place. Owing to the nature of the actuation of the LED chains, the possibility of the higher luminous intensity is not utilized, however, as a result of which the LED chips in the LED chains are not used optimally.

Furthermore, at least two LED chains, one driver per LED chain and one control unit for the drivers is required for this method of variable-color LED light.

As a result, dimmable, variable-color LED lights can be more cost-intensive than LED lights without the possibility of color variation.

SUMMARY

In various embodiments, an optoelectronic component device is provided with which it is possible, in a technically simple manner, with little complexity in terms of circuitry, to realize a dimmable, color-variable LED light.

Within the scope of this description, a group of optoelectronic components can also be understood to mean a pixel and/or a cluster of in each case a plurality of optoelectronic components.

Within the scope of this description, an optoelectronic component can be understood to mean a component emitting electromagnetic radiation. In various embodiments, an optoelectronic component can be a semiconductor component emitting electromagnetic radiation and/or be in the form of a diode emitting electromagnetic radiation, an organic diode emitting electromagnetic radiation, a transistor emitting electromagnetic radiation or an organic transistor emitting electromagnetic radiation. The radiation can be, for example, light in the visible range, UV light and/or infrared light. In this context, the component emitting electromagnetic radiation can be in the form of, for example, a light-emitting diode (LED), an organic light-emitting diode (OLED), a light-emitting transistor or an organic light-emitting transistor. The light-emitting component can, in various embodiments, be part of an integrated circuit. Furthermore, a plurality of light-emitting components can be provided, for example accommodated in a common housing.

Within the scope of this description, provision of electromagnetic radiation can be understood to mean emission of electromagnetic radiation.

Within the scope of this description, takeup of electromagnetic radiation can be understood to mean absorption of electromagnetic radiation.

Within the scope of this description, a cycle can be understood to mean a period of, for example, a point-symmetrical and/or mirror-symmetrical geometric function, for example an oscillation similar to or equivalent to a sine function, cosine function. The geometric function can be phase-shifted and/or modulated with further geometric functions, for example superimposed.

In various embodiments, an optoelectronic component device is provided, which optoelectronic component device has: a first group of optoelectronic components including at least one first optoelectronic component, wherein the at least one first optoelectronic component is designed to provide electromagnetic radiation of a first color valence; a second group of optoelectronic components including at least one second optoelectronic component, wherein the at least one second optoelectronic component is designed to provide electromagnetic radiation of a second color valence; and a phase dimmer, wherein the phase dimmer is designed in such a way that a first operating mode with a first degree of dimming and a second operating mode with a second degree of dimming are provided, wherein the phase dimmer actuates the first group of optoelectronic components and the second group of optoelectronic components in such a way that, in the first operating mode, a first array of optoelectronic components of the optoelectronic component device is energized and, in the second operating mode, a second array of optoelectronic components of the optoelectronic component device is energized; wherein, with respect to the total intensity of the electromagnetic radiation provided of the optoelectronic component device, the proportion of electromagnetic radiation of the first color valence is less in the first operating mode than in the second operating mode and the proportion of the electromagnetic radiation of the second color valence is greater in the first operating mode than in the second operating mode.

Within the scope of this description, as dimming increases, i.e. as the degree of dimming increases, the intensity of the electromagnetic radiation which is provided by the dimmed optoelectronic component device becomes lower with respect to the intensity of the electromagnetic radiation which is provided by the undimmed optoelectronic component device.

In one configuration, the second array of optoelectronic components can differ from the first array of optoelectronic components in such a way that the second array has at least one of the following differences with respect to optoelectronic components which provide electromagnetic radiation: a different number, a different design, a different geometric arrangement and/or a different size of the illuminated section.

By means of the phase dimming, the ON time, i.e. the time within which the operating voltage is present at the groups of optoelectronic components, is too short for energizing the second group of optoelectronic components. The second group of optoelectronic components can no longer provide electromagnetic radiation in the deenergized state. As a result, the second array of energized optoelectronic components can have, for example, fewer optoelectronic components which provide electromagnetic radiation.

In other words: the phase dimmer of the optoelectronic component device can be designed in such a way that the first group of optoelectronic components and the second group of optoelectronic components are actuated in such a way that, in the second operating mode, for example at a higher degree of dimming, the first group of optoelectronic components can still provide electromagnetic radiation, while the second group of optoelectronic components can no longer provide electromagnetic radiation since this group is no longer energized.

In one configuration, the phase dimmer can be designed for the phase gating control and/or phase chopping control of the optoelectronic components.

In one configuration, the first group of optoelectronic components can have at least one optoelectronic component more or fewer than the second group of optoelectronic components.

In one configuration, the first group of optoelectronic components can have approximately twice as many or approximately half as many optoelectronic components as the second group of optoelectronic components.

In one configuration, the first group of optoelectronic components can be connected electrically upstream of the second group of optoelectronic components.

In one configuration, the first group of optoelectronic components and/or the second group of optoelectronic components can have a series circuit, a parallel circuit and/or a combination of a series circuit and a parallel circuit of optoelectronic components.

In one configuration, the optoelectronic component device can be designed in such a way that the second optoelectronic components surround the first optoelectronic components at least partially in their arrangement.

In one configuration, the energized array of optoelectronic components of the optoelectronic component device can be smaller in the second operating mode than in the first operating mode.

In other words, the optoelectronic component device can be designed in such a way that the number of optoelectronic components and therefore the area of the optoelectronic component device from which electromagnetic radiation is provided, for example the size of the illuminated section, decreases as the dimming increases.

In one configuration, the illuminated section can have an areally cohesive geometric shape, for example a circle, a rectangle, a polygon or the like.

In one configuration, the first group of optoelectronic components can be surrounded concentrically by the second group of optoelectronic components. As a result, the illuminated area can decrease from the outside inwards as the degree of dimming increases.

In one configuration, the second group of optoelectronic components can be surrounded concentrically by the first group of optoelectronic components. As a result, the illuminated area can decrease from the inside outwards as the degree of dimming increases.

In one configuration, the first group of optoelectronic components and/or the second group of optoelectronic components can have one of the following arrangements: star-shaped, circular, rectangular, polygonal, arbitrary.

In one configuration, the optoelectronic components in the first group and/or the second group have a concentric arrangement, for example in the form of rings, triangles, circles, cylinders, rectangles, squares, ellipses or similar geometric figures.

In one configuration, the first color valence can have a different color locus than the second color valence.

In one configuration, the first color valence can have a higher correlated color temperature than the second color valence.

In one configuration, the first color valence can have a lower correlated color temperature than the second color valence.

In one configuration, the optoelectronic component device can furthermore have at least one third group of optoelectronic components including at least one third optoelectronic component.

In one configuration, the at least one optoelectronic component of the third group of optoelectronic components can have different optoelectronic properties with respect to the optoelectronic component of the first group of optoelectronic components and/or the second group of optoelectronic components.

In one configuration, the third group of optoelectronic components can provide electromagnetic radiation with a third color valence.

In one configuration, the third color valence can have a correlated color temperature whose value is formed between the first color valence and the second color valence.

The third group of optoelectronic components can be designed in such a way that the optoelectronic properties of the electromagnetic radiation which is provided by the third group of optoelectronic components have properties of the first group of optoelectronic components and/or the second group of optoelectronic components, for example an increase and/or a reduction in the relative proportion of the electromagnetic radiation which is provided by the at least one third optoelectronic component.

In one configuration, the optoelectronic component device can be designed as a dimmable light, wherein the color valence of the electromagnetic radiation provided is changed over during dimming from the first color valence to the second color valence.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 1 shows a tabular overview of the luminous efficacy of an optoelectronic component device in accordance with various configurations;

DETAILED DESCRIPTION

Figure 2:
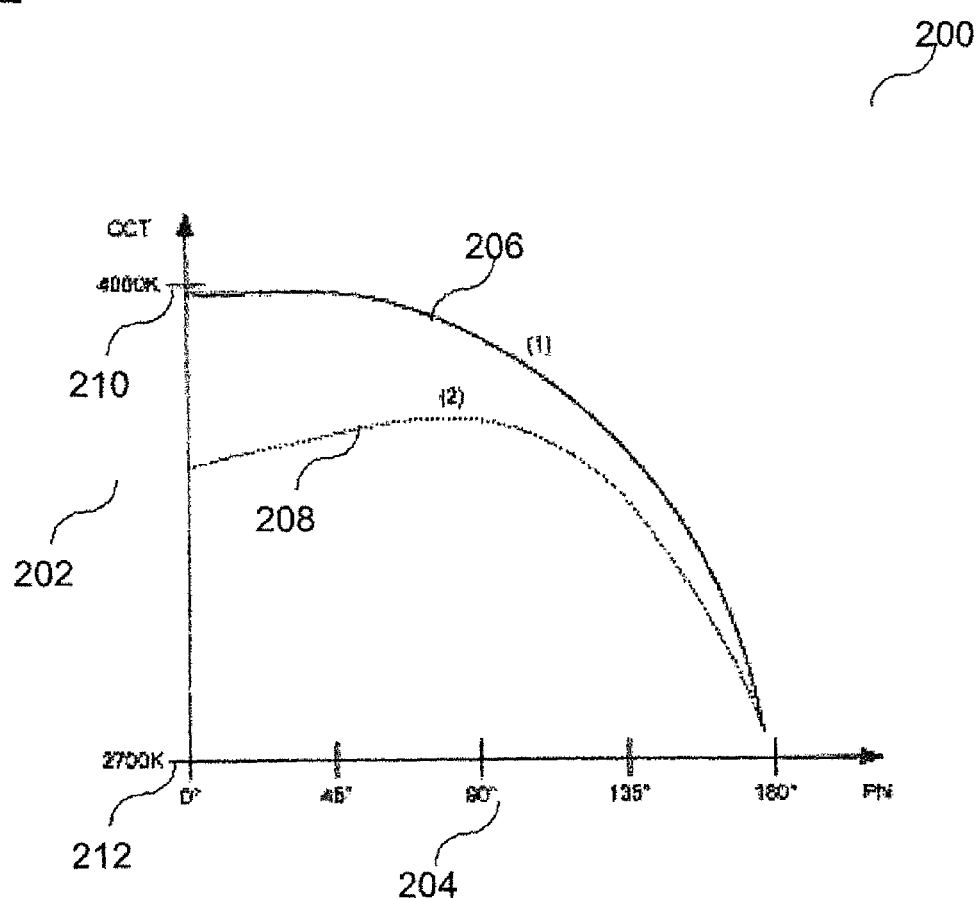
FIG. 2 shows a graph depicting the relationship between color temperature and phase angle for two configurations of an optoelectronic component device, in accordance with various configurations.

In the following detailed description, reference is made to the attached drawings, which form part of this description and which show, for illustrative purposes, specific embodiments in which the disclosure can be implemented. In this respect, directional terminology such as, for example, "at the top", "at the bottom", "at the front", "at the rear", "front", "rear", etc. is used with reference to the orientation of the figure(s) described. Since components from embodiments can be positioned in a number of different orientations, the directional terminology is used for illustrative purposes and is in no way restrictive. It goes without saying that other embodiments can be used and structural or logical changes can be performed without departing from the scope of protection of the present disclosure. It goes without saying that the features of the various embodiments described herein can be combined with one another where no specific mention is made to the contrary. The following detailed description should therefore not be interpreted in a restrictive sense, and the scope of protection of the present disclosure is defined by the attached claims.

Within the scope of this description, the terms "connected" and "coupled" are used to describe both a direct and an indirect connection and a direct or indirect coupling. In the figures, identical or similar elements are provided with identical reference symbols, insofar as this is expedient.

FIG. 1 shows a tabular overview of the luminous efficacy of an optoelectronic component device, in accordance with various configurations.

Any design of a high-voltage circuit of optoelectronic components can be used for the optoelectronic component device. However, the relative proportion of light which is provided by at least one optoelectronic component in a group of optoelectronic components of the optoelectronic component device should be dependent on the phase angle (in degrees) of the dimming in the circuit.

A relative proportion of light can be understood to mean the average luminous intensity which is provided during a cycle by an optoelectronic component with respect to the total luminous intensity provided by the optoelectronic component device, wherein the light is provided by at least one optoelectronic component in a group of optoelectronic components.

An optoelectronic component device can have a plurality of groups of optoelectronic components, wherein the optoelectronic components are arranged in a common electrical circuit, for example have a common current source.

The optoelectronic components can be designed, for example, as light-emitting diodes (LEDs).

The voltage input of each group of optoelectronic components can be bypassed by means of an electrical switch.

The switch should be designed in such a way that the ON time can be set by means of the average amplitude of the input voltage.

The ON time can be understood to mean the time in which the electrical switch of a group of optoelectronic components is open and an electrical current flow through the group of optoelectronic components can take place.

Such an electrical switch for bypassing can be, for example, a triac, a transistor, for example a MOSFET, a thyristor or a similar electronic component, for example a circuit or an integrated circuit with a similar function.

The optoelectronic components themselves do not need to be bypassed directly, for example when the groups of optoelectronic components have energy stores, for example capacitors. The electromagnetic radiation which is provided by an optoelectronic component can therefore sometimes be modulated significantly at twice the frequency of the input voltage.

The input voltage of the group of optoelectronic components can be, for example, an AC voltage, for example a rectified AC voltage.

The average amplitude of the input voltage can be varied, for example, by means of phase gating control and/or phase chopping control.

Figure 3:
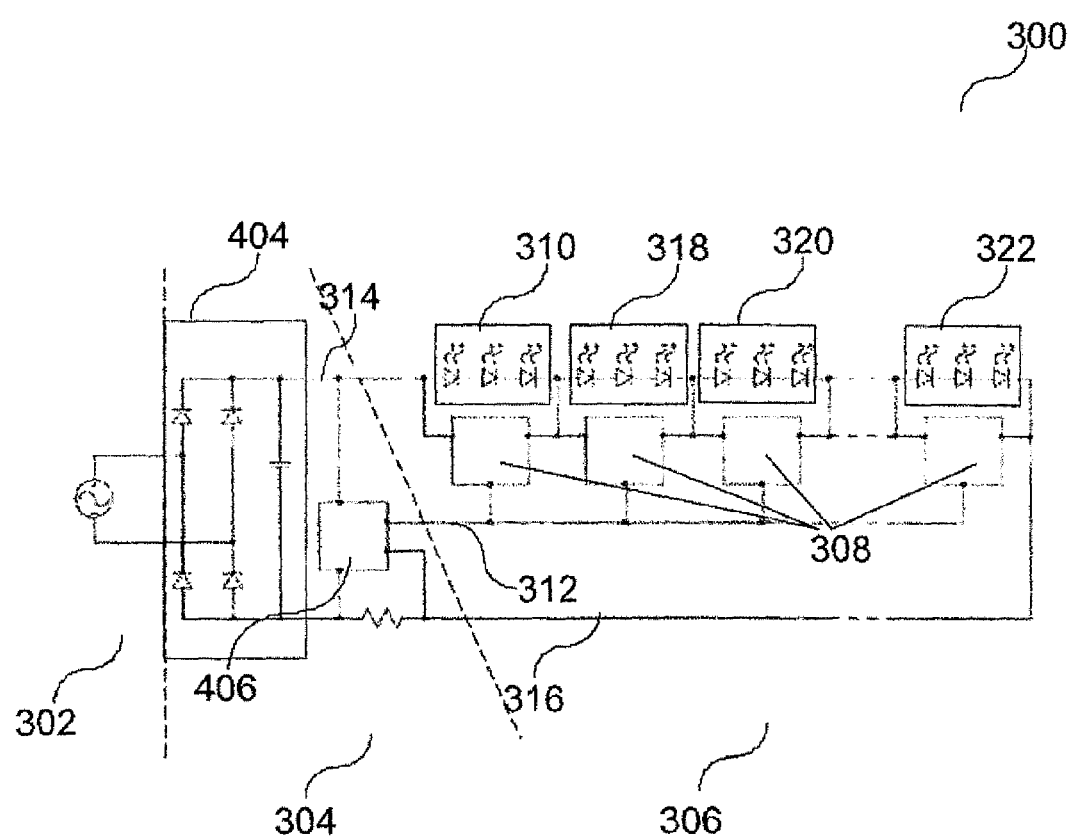
FIG. 3 shows a configuration of a circuit of an optoelectronic component device, in accordance with various configurations.
Figure 4:
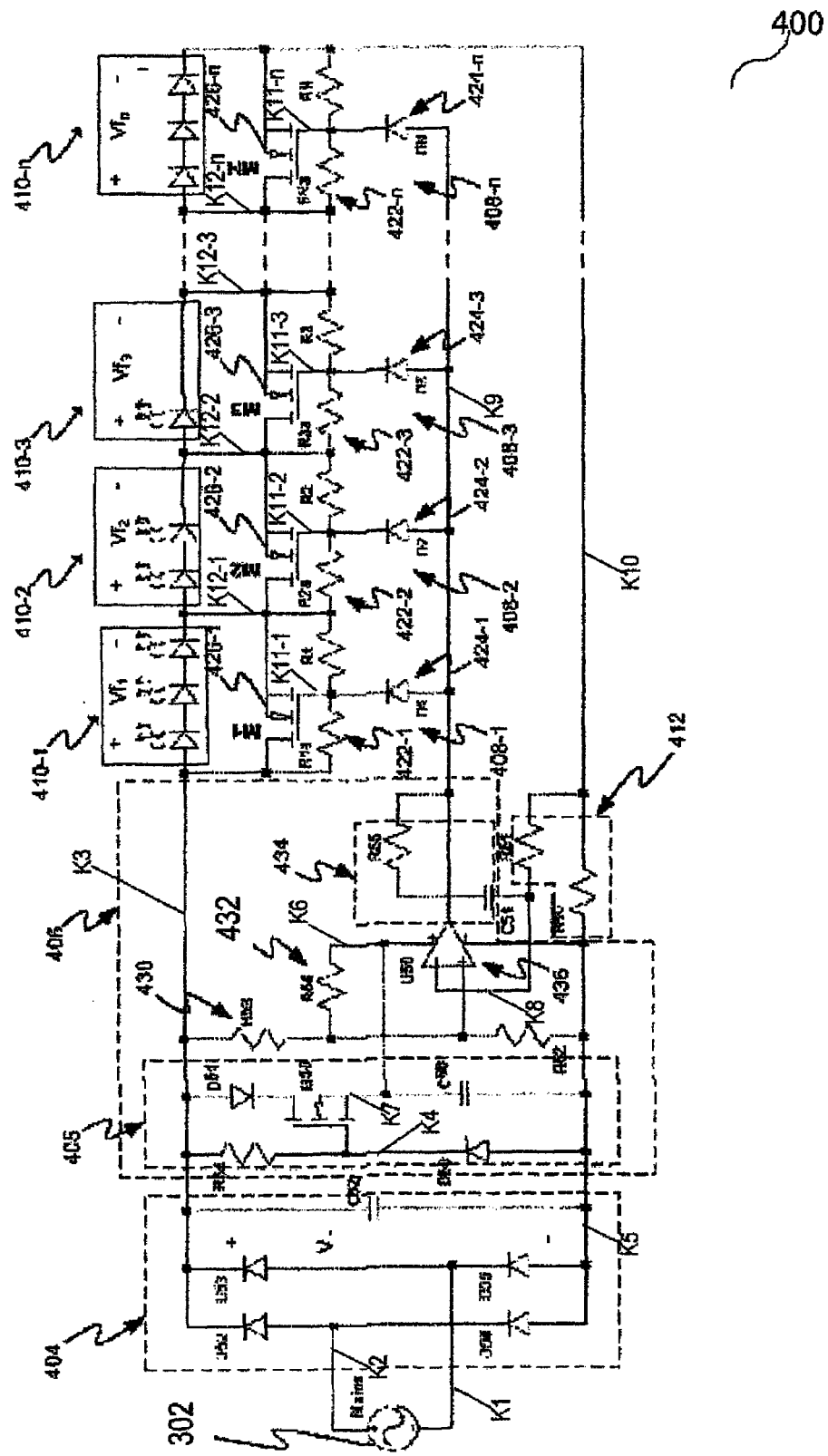
FIG. 4 shows a configuration of a circuit of an optoelectronic component device, in accordance with various configurations.
Figure 5:
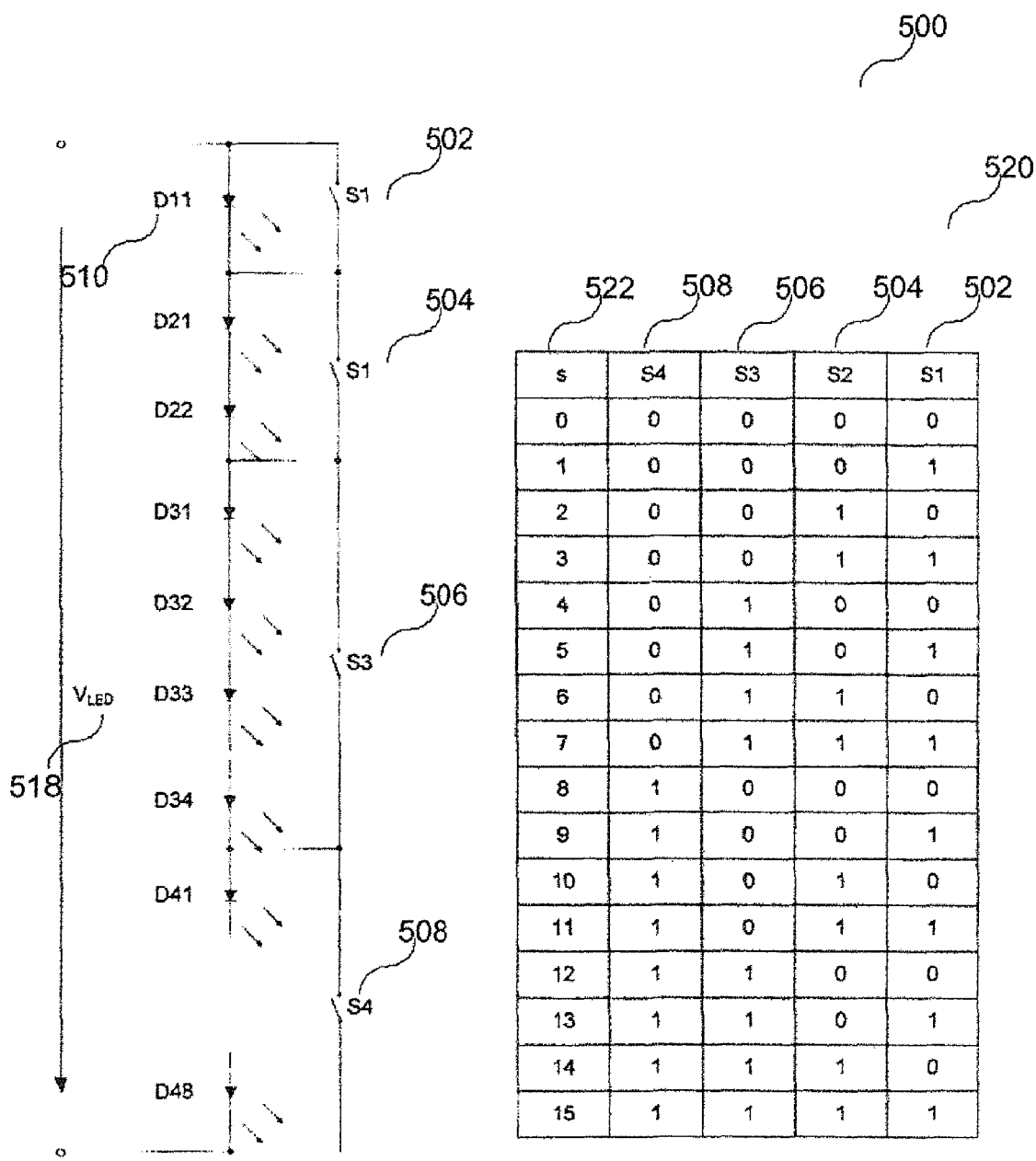
FIG. 5 shows a configuration of a circuit of an optoelectronic component device in accordance with various configurations.

A specific configuration for the actuation of the groups of optoelectronic components can be designed, for example, to be similar or equivalent to one of the configurations of a circuit/phase dimmer provided in the descriptions relating to FIGS. 3 to 5.

The different groups of optoelectronic components can be interconnected and connected to a phase dimmer in such a way that the optoelectronic components, at a high phase angle, provide less electromagnetic radiation in absolute terms.

In other words: the optoelectronic component device can be dimmed by means of the phase angle, for example by means of phase gating control and/or phase chopping control.

Within the scope of this description, the phase angle Phi can be understood to mean the angular interval in a half-cycle of the input voltage, while no voltage is applied to the groups of optoelectronic components by means of the dimmer. The phase angle can have, for example, a magnitude in a range of from approximately 0° to approximately 180°.

A phase angle of approximately 0° can be understood as meaning undimmed. A phase angle of approximately 180° can be understood as maximum dimming. Maximum dimming can be understood as similar or equivalent to an open switch which is connected electrically in series with the group of dimmed optoelectronic components.

The specific relationship between the phase angle and the color temperature of the total electromagnetic radiation provided can be dependent on the configuration of the circuit, for example of the phase dimmer, for example on the number of optoelectronic components in the group and the color valence of the electromagnetic radiation which is provided by the optoelectronic components in the respective group.

The first table 100 represents, for one configuration of an optoelectronic component device, i.e. for illustrating the principle and without any loss of generality, for phase angles of 45° (108), 90° (110) and 135° (112), the absolute intensities of the electromagnetic radiation, i.e. the luminous intensity in lumens which is provided by the individual groups 102, 104, 106 of optoelectronic components.

It can be seen from the sum 114 of the luminous intensity provided that the luminous intensity decreases as the phase angle increases.

The second table 120 represents the relative proportion for the electromagnetic radiation shown in table 100 provided by the individual groups 102, 104, 106 of optoelectronic components with respect to the total electromagnetic radiation 114 provided (100%).

The relative proportion of the electromagnetic radiation which is provided by the first group increases from approximately 52% to approximately 70% on dimming, as can be seen from the relative proportion of the electromagnetic radiation provided by the first group 102 with respect to the total electromagnetic radiation 114 provided by the optoelectronic component device.

The relative proportion of the electromagnetic radiation provided by the second group 106 is reduced from approximately 18% to approximately 0% on phase dimming, i.e. in the case of an increase in the phase angle.

In other words: with respect to the increase in the phase angle, the relative proportion of the luminous intensity of the electromagnetic radiation provided by the second group 106 is in opposition to the relative proportion of the electromagnetic radiation provided by the first group 102, wherein the relative proportion can relate to the total electromagnetic radiation provided by the optoelectronic component device given a phase angle.

The configuration of this property of the optoelectronic component device, i.e. the opposite behavior of the first group and second group, can be realized by means of suitable selection of the phase gating control and/or phase chopping control (see descriptions relating to FIG. 3 to FIG. 5).

The relative proportion of the electromagnetic radiation provided by the third group 104 can have properties of the first group 102 and/or of the second group 106, i.e. can be arranged with respect to the luminous intensity between the luminous intensity of the first group 102 and the luminous intensity of the second group 106.

The proportion of the electromagnetic radiation provided by the third group 104 can first increase by means of the increase in the phase angle, as can be seen in the luminous intensities of the phase angles of 45° (108) to 90° (110). On further dimming, the luminous intensity of the second group 104 can decrease again, as can be seen in the luminous intensities of the phase angles of 90° (110) to 135° (112).

An optoelectronic component can provide, for example, electromagnetic radiation which can be associated, for example can be correlated, with a color temperature (a black body or a blackbody radiator or Planckian radiator) for example in a range of from approximately 1000 K to approximately 8000 K, for example approximately 2500 K to approximately 6000 K.

The different groups of optoelectronic components can have optoelectronic components with the same and/or different design.

The optoelectronic components in the groups of optoelectronic components can be in the form of, for example, inorganic LEDs, for example GaN diodes, InGaN diodes or InGaAlP diodes.

Two or more light-emitting diodes can have, for example, a converter element, for example a phosphor layer.

Two or more light-emitting diodes can have, for example, an identical or different design.

Two or more light-emitting diodes can have, for example, an identical or different converter element.

Within the scope of this description, a phosphor is understood to mean a substance which converts, with losses, electromagnetic radiation of one wavelength into electromagnetic radiation of another wavelength, for example a longer wavelength (Stokes shift) or shorter wavelength (anti-Stokes shift), for example by means of phosphorescence or fluorescence. The energy difference from absorbed electromagnetic radiation and emitted electromagnetic radiation can be converted into phonons, i.e. heat, and/or by means of emission of electromagnetic radiation with a wavelength as a function of the energy difference.

A phosphor can include or be formed from, for example, $Ce^{3+}$-doped garnets such as YAG:Ce and LuAG, for example $(Y, Lu)_3(Al, Ga)_5O_{12}:Ce^{3+}$; $Eu^{2+}$-doped nitrides, for example $CaAlSiN_3:Eu^{2+}$, $(Ba, Sr)_2Si_5N_8:Eu^{2+}$; $Eu^{2+}$-doped sulfides, SiONe, SiAlON, orthosilicates, for example $(Ba, Sr)_2SiO_4:Eu^{2+}$; chlorosilicates, chlorophosphates, BAM (barium magnesium aluminate:Eu) and/or SCAP, halophosphate.

By means of the different color valence of the groups of optoelectronic components and the properties described, for example in the description relating to FIG. 4, during phase dimming, a change in the color valence of the electromagnetic radiation provided can be realized during dimming.

The at least one group of optoelectronic components, for example the first group 102 which provided a large amount of electromagnetic radiation at small phase angles with respect to the same group at small phase angle 108, can have optoelectronic components which can provide electromagnetic radiation with a low color temperature.

The at least one group of optoelectronic components, for example the third group 106, which provides a small amount of light at a large phase angle 112, with respect to the electromagnetic radiation provided by the same group at high phase angles 112, can have optoelectronic components which can provide electromagnetic radiation with a high color temperature.

In one configuration, the optoelectronic components can provide electromagnetic radiation with a correlated color temperature in a range of from approximately 1000 K to approximately 8000 K.

In one configuration, the optoelectronic components, for example in the first group 102, can provide electromagnetic radiation with a correlated color temperature in a range of from approximately 2000 K to approximately 3500 K, for example approximately 2700 K; in the second group 104, can provide electromagnetic radiation with a correlated color temperature in a range of from approximately 3500 K to approximately 8000 K, for example approximately 4500 K; and in the third group 106, can provide electromagnetic radiation with a correlated color temperature in a range of from approximately 2000 K to approximately 8000 K, for example approximately 3500 K. By means of this configuration, incandescence, for example similar or equivalent to the incandescence during dimming of a tungsten incandescent lamp, can be realized, for example, as dimming behavior.

In further configurations of the optoelectronic component device, optoelectronic components with different color temperatures, for example 5500 K, and a fourth group and/or further groups of optoelectronic components, for example with a further color temperature, for example 3800 K, can be realized in the optoelectronic component device.

In a further configuration, at least some of a group of optoelectronic components can provide electromagnetic radiation which does not correspond to the color temperature of a black body, for example a spectral color or another color locus.

FIG. 2 shows a graph illustrating the relationship between the color temperature and the phase angle for two configurations of an optoelectronic component device, in accordance with various configurations.

In one configuration of an optoelectronic component device, the optoelectronic component device can have an energy store, for example a capacitor.

The energy store can influence the emission characteristic of the optoelectronic component device during dimming, as can be seen from the graph 200.

In the graph 200, the relationship between the correlated color temperature 202 of electromagnetic radiation provided and the phase angle 204 for a configuration of an optoelectronic component device with an energy store is illustrated in a first characteristic 206 and for a configuration of an optoelectronic component device without energy store is illustrated in a second characteristic 208.

In the graph, the profile of the color locus as a function of the dimming level, dimming degree or the phase angle can be seen. By means of the configuration of the optoelectronic component device with phase dimmer, the color locus can be varied with the phase angle, i.e. during the course of dimming, from the first color valence 212 towards the second color valence 210. The change in the color locus over the course of the dimming can be constant, for example continuous.

Irrespective of the specific configuration of the optoelectronic component device, for example of the circuit, the phase dimmer and/or the design of the optoelectronic components, a drop in the correlated color temperature at high phase angles, i.e. at a high dimming degree, during phase dimming can be formed by means of the method described above in FIG. 1 for selecting the correlated color temperature of the optoelectronic components, for example similar or equivalent to incandescence of the electromagnetic radiation provided during dimming.

FIG. 3 shows a configuration of a circuit of an optoelectronic component device, in accordance with various configurations.

In view 300, a schematic view of a circuit for operating an optoelectronic component device is illustrated, in accordance with various configurations.

What is illustrated is a voltage supply 302, a driver structure 304 and a lighting structure 306.

The driver structure 304 can have, for example, a rectifier circuit 404 and a controller circuit 406. Further details in respect of the components of the driver structure 304 can be gleaned from the description relating to FIG. 4.

The driver structure 304 can, in accordance with various embodiments, be designed at least partially as phase dimmer 304 or be understood to be a phase dimmer 304.

The lighting structure 306 can have one or more switches 308 and one or more groups of optoelectronic components 310.

The groups of optoelectronic components 310, 318, 320, 322 can be switched on and/or off by means of the switches 308.

The lighting structure 306 can have any desired number of groups of optoelectronic components.

Each group of optoelectronic components 310, 318, 320, 322 can have any desired number of optoelectronic components and/or electrical resistors.

The groups of optoelectronic components 310, 318, 320, 322 can have an identical or different number of optoelectronic components, of an identical and/or different design.

For this purpose, the switches 308 can be electrically connected to the driver structure 304, for example by means of a controller line 312. Furthermore, the at least one switch 308 can be electrically connected to at least one group of optoelectronic components 310.

The groups of optoelectronic components 310 can be electrically connected by means of a first chain line 314 and a second chain line 316, wherein the first chain line 314 can have a different electrical potential than the second chain line 316.

FIG. 4 shows a configuration of a circuit of an optoelectronic component device, in accordance with various embodiments.

In a further configuration of the optoelectronic component device, the circuit for operating the optoelectronic components can be designed to be similar to or equivalent to a circuit without an energy store (zero energy storage ZES), for example similar or equivalent to the configuration of a circuit diagram illustrated in view 400.

The connection of the electrical and/or electronic components using electrical nodes will be described below.

Within the scope of this description, a node K can be understood to be an electrical equipotential, for example an electrical line with a constant electrical potential to which a plurality of electrical and/or electronic components can be connected.

View 400 shows a circuit with a voltage source 302; a rectifier circuit 404; a controller circuit 406; a current monitoring circuit 412 including resistors R50 and R51; a chain of optoelectronic components including a multiplicity of groups of optoelectronic components 410-1, 410-2, 410-3, 410-n and a multiplicity of switch circuits 408-1, 408-2, 408-3, 408-n.

The voltage source 302 can be connected to the node K1 and the node K2.

The resistor R50 (shunt) can be connected to the node K5 and the node K10.

The resistor R51 can be connected to the node K8 and the node K10.

The first group of optoelectronic components 410-1 can be connected on the input side to the node K3 and, in the forward direction, on the output side to the node K12-1.

The second group of optoelectronic components 410-2 can be connected on the input side to the node K12-1 and, in the forward direction, on the output side to the node K12-2.

The third group of optoelectronic components 410-3 can be connected on the input side to the node K12-2 and, in the forward direction, on the output side to the node K12-3.

The n-th group of optoelectronic components 410-n can be connected on the input side to the node K12-n and, in the forward direction, on the output side to the node K10.

Further groups of optoelectronic components can be connected on the input side to the node K12-3 and, in the forward direction, on the output side to the node K12-n (not illustrated).

The further groups of switch circuits of the further groups of optoelectronic components can be connected to the node K12-3 and the node K12-n (not illustrated).

The further high-voltage diode of the further controller protection circuit of the further groups of switch circuits can be connected to the node K9 (not illustrated).

Each of the switch circuits 408-1, 408-2, 408-3, 408-n can be connected in parallel with at least one group of optoelectronic components 410-1, 410-2, 410-3, 410-n. In other words, each of the switch circuits 408-1, 408-2, 408-3, 408-n can be associated with at least one group of optoelectronic components 410-1, 410-2, 410-3, 410-n.

A group of optoelectronic components 410-1, 410-2, 410-3, 410-n can have at least one optoelectronic component, for example two or more optoelectronic components.

An optoelectronic component can be, for example, a light-emitting diode, for example an organic and/or inorganic light-emitting diode.

Two or more optoelectronic components in the same group and/or different groups can have an identical or different design, for example provide electromagnetic radiation with a different color valence and/or have further optical components, for example optical lenses, wavelength converters or the like.

The optoelectronic components of one or more groups of optoelectronic components can be tightly packed, for example arranged next to one another.

As a result, the electromagnetic radiation of different color temperatures can be mixed well and fewer diffusers may be required.

The groups of optoelectronic components 410-1, 410-2, 410-3, 410-n can be arranged, for example, partially in a common package and/or in a common housing.

The current for operating the multiplicity of groups of optoelectronic components 410-1, 410-2, 410-3, 410-n can be provided by a voltage source 302. The voltage source 302 can be designed, for example, as an AC source 302, for example an electric grid, and/or for providing an AC voltage.

In one configuration, the voltage source 302 can also be designed as a DC source 302, for example a battery 302 or the like.

In the case of an AC source 302, the circuit 400 can have a rectifier 404 and/or a rectifier circuit 404 designed for rectifying the current flow through the circuits of the optoelectronic component device 304, 306. The rectifier circuit 404 can be electrically coupled to the AC source 302. In other words: an AC voltage source 302 can provide an AC voltage to the rectifier circuit 404.

The rectifier 404 can have, for example, a multiplicity of electronic components, for example diodes, for example D52, D53, D54 and D55, and/or an energy store, for example a capacitor, for example C52.

The rectifier 404 can be designed similarly or equivalently to a conventional rectifier circuit 404 for rectifying alternating current, for example similarly or equivalently to a bridge rectifier 404, a half-wave rectifier 404 and/or a full-wave rectifier 404. In the case of a DC source, a rectifier circuit 404 can be optional.

In the case of a bridge rectifier 404:
  the diode D52 can be connected to the node K2 by means of the anode and to the node K3 by means of the cathode;
  the diode D53 can be connected to the node K1 by means of the anode and to the node K3 by means of the cathode;
  the diode D54 can be connected to the node K5 by means of the anode and to the node K2 by means of the cathode; and
  the diode D55 can be connected to the node K5 by means of the anode and to the node K1 by means of the cathode.

A rectified input voltage $V_N$ can be provided at the capacitor C52 by means of the rectifier 404.

The controller circuit 406 can have a supply voltage circuit 405, a voltage reference circuit 430 including the resistors R52 and R53, a voltage negative feedback circuit 432, including the resistor R56, an operational amplifier circuit 436 including operational amplifier U50 and a frequency compensation circuit 434 including the resistor R55 and capacitor C51, or are formed therefrom.

The resistor R52 can be connected to the node K5 and the node K7.

The resistor R53 can be connected to the node K3 and the node K7.

The resistor R56 can be connected to the node K6 and the node K7.

The operational amplifier U50 can be connected, with the input for the positive supply voltage, to the node K6 and, with the other input for the supply voltage, to the node K5.

The inverting input of the operational amplifier U50 can be connected to the node K8 and the non-inverting input can be connected to the node K7.

The output of the operational amplifier U50 can be connected to the node K9.

The supply voltage for the operational amplifier circuit 436 can be provided by means of a supply voltage circuit 405.

The supply voltage circuit 405 can have a resistor R54, a Zener diode D50, a diode D51, a capacitor C50, and a switch, for example a MOSFET M50.

The resistor R54 can be connected to the node K3 and the node K4.

The capacitor C50 can be connected to the node K5 and the node K6.

The diode D50 can be connected with the cathode to the node K4 and with the anode to the node K5.

The diode D51 can be connected with the anode to the node K3 and with the cathode to the drain connection of the MOSFET switch M50.

The MOSFET switch M50 can be connected with its gate connection to the node K4, with its source connection to the node K6 and with its drain connection to the cathode of the diode D51.

These components can be coupled to the output of the rectifier circuit 404, i.e. the node K3 and the node K5, and provide a low DC voltage, for example with a value of approximately 5 V, as voltage at the capacitor C50.

The capacitor C50 can additionally be coupled to the supply voltage input of the operational amplifier U50 and thus provide the supply voltage for the operational amplifier U50.

The resistors R52 and R53 of the voltage reference circuit 430 are provided in a voltage divider arrangement with a connection, for example a tap, between the resistor R52 and the resistor R53. This connection can be coupled to the non-inverting input of the operational amplifier U50 as a voltage reference signal.

The output signal of the current monitoring circuit 412, for example of the voltage across the resistor R51, can be representative of the current which is flowing through the multiplicity of groups of optoelectronic components 410-1, 410-2, 410-3, 410-n and can be measured across the resistor R51.

The output signal of the current monitoring circuit 412 can be coupled to the inverting input of the operational amplifier U50.

As a result, the current which passes into the controller circuit 406 can be monitored, with the result that the controller circuit 406 can limit the total current flow which flows through the groups of optoelectronic components 410-1, 410-2, 410-3, 410-n.

As a result, damage, for example by means of electrostatic discharge, can be prevented at the optoelectronic components.

In one configuration, the current monitoring circuit 412 can also be designed to monitor the current input of the operational amplifier U50 in combination with an active feedback. As a result, the current flow through the optoelectronic components in the multiplicity of groups of optoelectronic components 410-1, 410-2, 410-3, 410-n can be regulated in such a way that the current flow through the optoelectronic components approximately follows the input current, which is provided by the voltage source 302.

As a result, reduced harmonic interference in the current flow in the circuit 400 can be ensured. The current flow can be set, for example, by means of matching the controller signal in the controller circuit 406.

In addition, the output signal of the frequency stabilization circuit 434 can be coupled to the inverting input of the operational amplifier U50.

The frequency stabilization circuit 434 can have a capacitor C51 and a resistor R55, wherein said capacitor and said resistor can be coupled to the output of the operational amplifier U50, i.e. the output signal of the controller circuit 406.

The resistor R55 can be connected to the capacitor C51 and the node K9.

The capacitor C51 can be connected to the resistor R55 and the node K8.

As a result, undesired oscillations and/or vibrations in the output signal of the controller circuit 406 can be reduced and/or prevented.

In order to increase the power factor of the circuit 400 for operating an optoelectronic component device, the output of the voltage negative feedback circuit 432 and the output signal of the supply voltage circuit 405 can be coupled to an input of the supply voltage of the operational amplifier U50.

The voltage negative feedback circuit 432 can have a resistor R56, which is arranged between the input of the supply voltage of the operational amplifier U50 and the connection, for example tap, between the resistor R53 and the resistor R52 and the non-inverting input of the operational amplifier U50.

This arrangement can compensate for voltage drops in the rectifier circuit 404 and improve the power factor. An improved power factor can also reduce harmonic interference.

The operational amplifier circuit 436 can form compensation between the current flowing through the multiplicity of groups of optoelectronic components 410-1, 410-2, 410-3, 410-n and the reference voltage signal which is provided by the reference voltage circuit 430.

The current through the groups of optoelectronic components 410-1, 410-2, 410-3, 410-n can be determined, for example, by means of the current through the resistor R51 of the current monitoring circuit 412.

The root mean square (RMS) of the current flow through the multiplicity of groups of optoelectronic components 410-1, 410-2, 410-3, 410-n can be set by means of changing the value of the resistor R52.

Each switch circuit of the plurality or multiplicity of switch circuits 408-1, 408-2, 408-3, 408-n can have a switch 426-1, 426-2, 426-3, 426-n, for example a triac, a transistor, for example a MOSFET (illustrated), a thyristor or a similar electronic component, for example a circuit or an integrated circuit with a similar function.

Without any loss of generality, the circuit will be described below with reference to a MOSFET switch 426-1, 426-2, 426-3, 426-n.

The source connection and the drain connection of the MOSFET switches 426-1, 426-2, 426-3, 426-n can be coupled to the connections of a group of optoelectronic components 410-1, 410-2, 410-3, 410-n which are associated with the respective switch circuit 408-1, 408-2, 408-3, 408-n of the respective switch 426-1, 426-2, 426-3, 426-n.

In other words:
- the MOSFET switch 426-1 (M1) can be connected with its gate connection to the node K11-1, with its source connection to the node K12-1 and with its drain connection to the node K3;
- the MOSFET switch 426-2 (M2) can be connected with its gate connection to the node K11-2, with its source connection to the node K12-2 and with its drain connection to the node K12-1;
- the MOSFET switch 426-3 (M3) can be connected with its gate connection to the node K11-3, with its source connection to the node K12-3 and with its drain connection to the node K12-2;
- the MOSFET switch 426-n (MN) can be connected with its gate connection to the node K11-n, with its source connection to the node K10 and with its drain connection to the node K12-n.

A switch 426-1, 426-2, 426-3, 426-n in a state in which it is conducting electric current (closed), can bypass the current through the group of optoelectronic components 410-1, 410-2, 410-3, 410-n which is associated with the switch circuit 408-1, 408-2, 408-3, 408-n.

As a result, the optoelectronic component of the bypassed groups of optoelectronic components 410-1, 410-2, 410-3, 410-n can be deenergized and cannot provide any light.

In other words: if a switch 426-1, 426-2, 426-3, 426-n of the multiplicity of switch circuits 408-1, 408-2, 408-3, 408-n is in a conducting state or drops, i.e. is closed, the group of optoelectronic components 410-1, 410-2, 410-3, 410-n which are associated with the switch 426-1, 426-2, 426-3, 426-n in a parallel circuit are bypassed or short-circuited by means of the current flow through the switch 426-1, 426-2, 426-3, 426-n.

In other words: if a switch circuit of the multiplicity of switch circuits 408-1, 408-2, 408-3, 408-n is in a nonconducting state with respect to an electric current, i.e. is open, the current can flow through the group of optoelectronic components 410-1, 410-2, 410-3, 410-n associated with the switch 426-1, 426-2, 426-3, 426-n. As a result, the group of optoelectronic components 410-1, 410-2, 410-3, 410-n associated with the open switch 426-1, 426-2, 426-3, 426-n can be energized and can provide electromagnetic radiation, for example emit light.

In the case of a switch 426-1, 426-2, 426-3, 426-n which is a state in which it is not conducting electric current or drops, a current can flow through the group of optoelectronic components 410-1, 410-2, 410-3, 410-n associated with the nonconducting switch circuit 408-1, 408-2, 408-3, 408-n. As a result, the at least one optoelectronic component can be energized, with the result that said optoelectronic component can provide electromagnetic radiation, for example light.

As a result, the bypassed group of optoelectronic components 410-1, 410-2, 410-3, 410-n can no longer be energized and cannot provide electromagnetic radiation.

In order to prevent damage to a nonconducting MOSFET switch 426-1, 426-2, 426-3, 426-n, for example in the case of a rectified input voltage and failure of the conductivity of an optoelectronic component, each switch circuit 408-1, 408-2, 408-3, 408-n can have a switch protection circuit 422-1, 422-2, 422-3, 422-n.

Failure of the conductivity of an optoelectronic component can be understood as meaning an interruption of a circuit, similar to an open switch in a conventional circuit.

A switch protection circuit 422-1, 422-2, 422-3, 422-n can have, for example, a first protective resistor R1a, R2a, R3a, RNa, which can be arranged between the drain connection and the source connection of the respective switch 426-1, 426-2, 426-3, 426-n associated with the switch protection circuit 422-1, 422-2, 422-3, 422-n.

In other words:
the resistor R1a can be connected to the node K3 and the node K11-1;
the resistor R2a can be connected to the node K12-1 and the node K11-2;
the resistor R3a can be connected to the node K12-2 and the node K11-3;
the resistor RNa can be connected to the node K12-n and the node K11-n.

The first protective resistor R1a, R2a, R3a, RNa can set the respectively associated MOSFET switch 426-1, 426-2, 426-3, 426-n into a conductive state if the conductivity of an optoelectronic component in the group of optoelectronic components 410-1, 410-2, 410-3, 410-n associated with the switch 426-1, 426-2, 426-3, 426-n fails.

The switch protection circuit 422-1, 422-2, 422-3, 422-n can have a second protective resistor R1, R2, R3, RN. The second protective resistor R1, R2, R3, RN can be arranged between the gate connection and the source connection of the switch 426-1, 426-2, 426-3, 426-n respectively associated with the switch protection circuit 422-1, 422-2, 422-3, 422-n.

In other words:
the resistor R1 can be connected to the node K11-1 and the node K12-1;
the resistor R2 can be connected to the node K11-2 and the node K12-2;
the resistor R3 can be connected to the node K11-3 and the node K12-3;
the resistor RN can be connected to the node K11-n and the node K12-n.

By means of the second protective resistor R1, R2, R3, RN it is possible to ensure that the MOSFET switch 426-1, 426-2, 426-3, 426-n can assume a nonconducting state.

The conducting state of each of the MOFSET switches 426-1, 426-2, 426-3, 426-n can be regulated by means of the output signal of the controller circuit 406.

In one configuration, the controller circuit 406 can be designed, for example, as the output of the operational amplifier U50 (illustrated).

The output signal of the controller circuit 406 can be coupled to the gate connection of each MOSFET switch 426-1, 426-2, 426-3, 426-n by the respective controller protection circuits 424-1, 424-2, 424-3, 424-n.

A controller protection circuit 424-1, 424-2, 424-3, 424-n can have, for example, a high-voltage diode D1, D2, D3, DN, wherein the high-voltage diodes D1, D2, D3, DN can have, in the reverse direction, a high breakdown voltage.

The diode D1 can be connected with the cathode to the node K11-1 and with the anode to the node K9.

The diode D2 can be connected with the cathode to the node K11-2 and with the anode to the node K9.

The diode D3 can be connected with the cathode to the node K11-3 and with the anode to the node K9.

The diode DN can be connected with the cathode to the node K11-n and with the anode to the node K9.

For each of the MOSFET switches 426-1, 426-2, 426-3, 426-n which is in a nonconducting state, the respective high-voltage diode D1, D2, D3, DN can be reverse-biased. As a result, the nonconducting switches 426-1, 426-2, 426-3, 426-n can be brought to the higher voltage of the respective energized group of optoelectronic components 410-1, 410-2, 410-3, 410-n. As a result, the controller circuit 406 can be protected from the higher voltage.

The higher potential can be understood to mean a floating electrical potential.

The respective high-voltage diodes D1, D2, D3, DN can be designed in such a way that the diodes D1, D2, D3, DN can resist the voltage occurring, for example withstanding, and not break down.

The groups of optoelectronic components 410-1, 410-2, 410-3, 410-n can have a different design, for example can provide electromagnetic radiation of different color temperature.

The optoelectronic components in a group of optoelectronic components 410-1, 410-2, 410-3, 410-n can be designed as a series circuit, as a parallel circuit and/or as a combination of a parallel circuit and a series circuit with respect to one another.

There may be a voltage drop $V_{fi}$ corresponding to the configuration of the respective group across each of the groups (index i) of optoelectronic components 410-1, 410-2, 410-3, 410-n.

The sum of the voltage drop across all of the groups should be approximately greater than the peak voltage of the rectified input voltage of the voltage supply 302.

In one configuration, the switch circuits 408-1, 408-2, 408-3, 408-n can be designed for bypassing non-active groups of optoelectronic components 410-1, 410-2, 410-3, 410-n and for bypassing the current of the controller circuit 406.

In another configuration, these functions can be separated, for example by virtue of the switch device being operated completely in an "on state" or "off state" and the current control by the controller circuit 406 being realized by means of a separate electronic component which can be connected electrically in series with the LED chain.

The optoelectronic components can be operated at frequencies which correspond approximately to the switching speed of the switch circuit 408-1, 408-2, 408-3, 408-n and/or the response time of the operating amplifier circuit 436 of the controller circuit 406. In other words, the frequency does not need to be restricted to the frequency of the input voltage of the voltage source 302.

The operational principle of a variable-color phase dimming of the optoelectronic component device, for example in accordance with a configuration from the description relating to FIG. 1 and/or FIG. 2 will be illustrated below with a configuration of the circuit for operating the optoelectronic component device similar to or equivalent to the configuration illustrated in view 400.

The principle of the current flow control function will be illustrated using the example of the circuit state of the MOSFET switch 426-2.

For an understandable description, the terms "to the left" and "to the right" are used which relate to the components and/or circuits to the left or right of the reference component and/or reference circuit in the configuration 400 illustrated of the circuit. The terms "to the left" and "to the right" should merely serve to make the circuit diagram more easily understandable and in no way give any information in respect of the geometric arrangement of the components with respect to one another.

In the case of a rectified input voltage $V_{in}$, the MOSFET switches for example to the left of the MOSFET switch 426-2, i.e. switch 426-1, can be in a nonconducting state (open) and all of the MOSFET switches to the right of the MOSFET switch 426-2, i.e. switches 426-3, 426-n, can be in a conducting state (closed).

It follows from this that all of the groups of optoelectronic components 410-1, 410-2, 410-3, 410-n to the left of the MOSFET switch 426-2 are energized, i.e. 410-1, and all of the groups of optoelectronic components 410-1, 410-2, 410-3, 410-n to the right of the MOSFET switch 426-2, i.e. 410-1, 410-n, are not energized.

The sum of the voltage drop across the energized optoelectronic components can be approximately lower than the rectified input voltage which is provided by the rectifier 404 by means of the first chain line 314 and the second chain line 316.

The voltage difference between the input voltage and the voltage drop across the energized group of optoelectronic components 410-1 can be present, for example as a voltage drop, across the MOSFET switch 426-2 and the group of optoelectronic components 410-2 associated with the MOSFET switch 426-2.

The voltage drop may be, for example, insufficient to energize the group of optoelectronic components 410-2 completely, i.e. with maximum current intensity, with the result that some of the current is conducted away by the MOSFET switch 426-2.

Since there is a voltage drop across the MOSFET switch 426-2, the MOSFET switch 426-1 to the left of the MOSFET switch 426-2 can have a source voltage which is greater than the source voltage of the MOSFET switch 426-2.

Since all of the gate connections of the MOSFET switches 426-1, 426-2, 426-3, 426-n are connected to a common controller line 312 by means of the high-voltage diodes D1, D2, D3, DN, the voltage drop between the gate connection and the source connection (gate-to-source voltage) of the MOSFET switch 426-1 to the left of the MOSFET switch 426-2 can be lower than the voltage drop between the gate connection and the source connection of the MOSFET switch 426-2.

As a result, no current or only a low current can flow through the MOSFET switch 426-2.

In addition, the high-voltage diode D1, which is coupled to the gate connection of the nonconducting MOSFET switch 426-1, is reverse-biased.

Furthermore, the second protective resistor R1 can reduce the voltage drop between the gate connection and the source connection of the nonconducting MOSFET switch 426-1, for example to 0 V. As a result, it is possible furthermore to ensure that the nonconducting MOSFET switch 426-1 remains nonconducting.

The MOSFET switches 426-1, 426-2, 426-3, 426-n can continue to support the maintenance of the current flow through the groups of optoelectronic components 410-1, 410-2, 410-3, 410-n at a specific level.

If the current flow through the groups of optoelectronic components 410-1, 410-2, 410-3, 410-n is small, the MOSFET switch 426-3 to the right of the MOSFET switch 426-2 can assume, for example form, a relatively high resistance.

As a result, the voltage at the source connection of the MOSFET switch 426-2 can increase and the MOSFET switch 426-2 can become nonconducting (can be opened).

If the rectified input voltage $V_{in}$ is changed, for example increases, for example by means of modulation over time of the input voltage or a change in the degree of dimming, the current flow through the group of optoelectronic components 410-2 which is associated with the MOSFET switch 426-2 can increase. At the same time, the current flow through the MOSFET switch 426-2 can decrease.

After a time, while the rectified input voltage increases, the current flow through the MOSFET switch 426-2 can peter out (i.e. the switch can be opened) and the current flow control function can transfer, for example be passed on, to the MOSFET switch 426-3 to the right of the MOSFET switch 426-2.

In the case of a specific current flow, the controller circuit 406 can have a supportive effect, by means of the controller signal of the controller line 312, in the maintenance of the specific current flow through the groups of optoelectronic components 410-1, 410-2, 410-3, 410-n. For this, the conducting state of the MOSFET switches 426-1, 426-2, 426-3, 426-n can be matched by means of active feedback by means of the current monitoring circuit 412.

In one configuration, the multiplicity of switch circuits 408-1, 408-2, 408-3, 408-n can be opened and/or closed directly, for example as a consequence of the change in voltage, for example of the voltage drop, across the multiplicity of groups of optoelectronic components. In one configuration, fine tuning of the current flow which is provided by the controller circuit 406 can be set by means of a controller signal.

The switch 426-3 and further switches 426-n can be opened in the same way until the sum of the voltage drops $V_{fi}$ of the energized groups of optoelectronic components 410-3, 410-n approximately reaches the magnitude of the input voltage.

By means of the serial, for example individual, opening of the switches 426-1, 426-2, 426-3, 426-n, the first group of optoelectronic components 410-1 can be energized for longer than all of the energized groups of optoelectronic components 426-2, 426-3, 426-n to the right of the first group 410-1.

The same applies to the second group 426-2 for the groups 426-3, 426-n to the right of the second group 426-2, etc.

The group of optoelectronic components with the shortest ON time can be the last still energized group of optoelectronic components, for example 410-n.

By means of the value of the resistor R52, the current through the groups of optoelectronic components can be set. This can also be understood as changing the dimmer trigger time.

The dimmer trigger time can be understood as meaning the phase angle of a half-cycle of the voltage provided above which the first switch 426-1 can transfer to a nonconducting state (open) and the optoelectronic components of the group 410-1 can provide electromagnetic radiation.

In one configuration for dimming the optoelectronic component device, the resistor R52 can be designed as a variable resistor R52, for example a potentiometer R52.

In other words: depending on the dimmer trigger time, the AC voltage which is provided by the voltage source 302, for example the instantaneous grid voltage, can only be connected with a delay. The delay can in this case correspond to the time associated with the phase angle. The time can be dependent on the frequency of an AC signal from the voltage source 402.

In other words: the voltage drop across the groups of optoelectronic components 410-1, 410-2, 410-3, 410-n and switch circuits 426-1, 426-2, 426-3, 426-n can be delayed with respect to the input voltage $V_{in}$.

At a dimmer trigger time, i.e. phase angle, of less than approximately 90°, this may be noticeable such that some groups of optoelectronic components, for example the group of optoelectronic components 426-3, 426-n, become darker first by means of the shorter switch-on width (pulse width). In accordance with the descriptions relating to FIG. 1 and FIG. 2, these groups of optoelectronic components can have, for example, light-emitting diodes which provide electromagnetic radiation with a higher correlated color temperature (second color valence) than the optoelectronic components of the groups with longer ON time (first color valence), for example the groups of optoelectronic components 408-1, 408-2.

By means of the relatively low, relative light proportion of the electromagnetic radiation of the second color valence, for example with a relatively high correlated color temperature, the total brightness, i.e. the total intensity of the electromagnetic radiation provided, and the correlated color temperature of the total electromagnetic radiation provided can be reduced (see also table 100).

In other words, during dimming predominantly the light proportions of the optoelectronic components of the relatively high color temperature can be reduced.

At the dimmer trigger point, i.e. at a phase angle, of above 90°, depending on the peak voltage, i.e. the instantaneous grid voltage or the input voltage at a group of optoelectronic components, the groups of optoelectronic components to the right, for example starting from the group of optoelectronic components 410-n towards the left, for example up to the group of optoelectronic components 410-1, i.e. the groups 410-n, 410-3, 410-2, can no longer provide any electromagnetic radiation, for example. In other words: the magnitude of the voltage provided via the groups of optoelectronic components can no longer be sufficient to set all of the switches in the groups of optoelectronic components 410-1, 410-2, 410-3, 410-n, for example the switches 426-3, 426-n, to a nonconducting state (to open said switches). In other words: at a degree of dimming with a phase angle of greater than approximately 90°, it is no longer possible for all of the groups of optoelectronic components to provide electromagnetic radiation.

At phase angles of greater than approximately 90°, the color valence, for example the correlated color temperature, of the total electromagnetic radiation provided can continue to shift in the direction of the color valence of the first group of optoelectronic components 408-1, for example because now only the groups of optoelectronic components which provide electromagnetic radiation with a first color valence, for example with a relatively low color temperature, provide electromagnetic radiation.

In other words: some groups of optoelectronic components 410-2, 410-3, 410-n have a relatively short ON time at high phase angles and/or some groups of optoelectronic components 410-2, 410-3, 410-n can no longer provide any electromagnetic radiation at all.

In other words, depending on the dimming, i.e. the setting of the phase angle, the illuminated section can change, for example the brightness, the color temperature of the electromagnetic radiation provided and the number of optoelectronic components providing electromagnetic radiation.

In other words: at high dimming trigger points, the brightness may be low, the color temperature can appear lower, for example, and the illuminated section can be reduced in size.

In a specific configuration, a first group of optoelectronic components 410-1 can provide electromagnetic radiation with a correlated color temperature of approximately 2700 K.

In a specific configuration, a first group of optoelectronic components 410-1 can have, for example, 19 optoelectronic components, for example light-emitting diodes.

In a specific configuration, a second group of optoelectronic components 410-2 can provide electromagnetic radiation with a correlated color temperature of approximately 3000 K.

In a specific configuration, a second group of optoelectronic components 410-2 can have, for example, approximately 18 optoelectronic components, for example light-emitting diodes.

In a specific configuration, a third group of optoelectronic components 410-3 can provide electromagnetic radiation with a correlated color temperature of approximately 3500 K.

In a specific configuration, a third group of optoelectronic components 410-3 can have, for example, approximately 25 optoelectronic components, for example light-emitting diodes.

In a specific configuration, a fourth group of optoelectronic components 410-4 can provide electromagnetic radiation with a correlated color temperature of approximately 4000 K.

In a specific configuration, a fourth group of optoelectronic components 410-4 can have, for example, approximately 15 optoelectronic components, for example light-emitting diodes.

In a specific configuration, a fifth group of optoelectronic components 410-5 can provide electromagnetic radiation with a correlated color temperature of approximately 4000 K.

In a specific configuration, a fifth group of optoelectronic components 410-5 can have, approximately 15 optoelectronic components, for example light-emitting diodes.

FIG. 5 shows a configuration of a circuit of an optoelectronic component device, in accordance with various configurations.

FIG. 5 shows part of a circuit design or circuit arrangement of an optoelectronic component device which may be suitable for operating the optoelectronic components of the optoelectronic component device.

A digital staircase converter is depicted.

The circuit for operating the optoelectronic component device can have a rectifier, which is electrically connected to a linear controller. The controller can provide a voltage $V_{LED}$ for a plurality of groups of optoelectronic components, for example light-emitting diodes.

In one configuration, each group of optoelectronic components can have approximately twice and/or approximately half the number of optoelectronic components of the following group in the current direction.

FIG. 5 illustrates, by way of example, the light-emitting diode/switch array in a circuit including four LED groups 510, 512, 514, 516.

Depending on the input voltage, the switches 502, 504, 506, 508 can be operated in a binary circuit pattern, illustrated in view 520. As a result, the voltage drop across the linear controller can be kept low and good electrical efficiency can be achieved.

If the dimming of the circuit has phase control, at large phase angles some of the groups of optoelectronic components with a large number of optoelectronic components can no longer be energized, for example the group of optoelectronic components 516.

The groups of optoelectronic components which are no longer switched on cannot be energized, for example, because the voltage drop $V_{LED}$ across the LED chain, i.e. across the energized groups of optoelectronic components, should be approximately lower than the input voltage applied.

In one configuration of the optoelectronic component device, the groups of optoelectronic components which are no longer energized at a high phase angle, i.e. at a high degree of dimming, can have optoelectronic components, for example LEDs, which provide electromagnetic radiation, which are correlated with a relatively high color temperature and/or have a higher number of optoelectronic components.

Groups of optoelectronic components, for example the group of optoelectronic components D41-D48 associated with switch 508, can have, for example, a greater probability of being energized at a high voltage than the first group of optoelectronic components 510.

The optoelectronic components with a greater probability of being energized at a relatively high current can provide, for example, electromagnetic radiation with a second color valence, for example a higher color temperature with respect to further groups of optoelectronic components of the optoelectronic component device.

The higher color temperature can, for example, also be higher with respect to the average color temperature of the group of optoelectronic components with respect to at least one further group of optoelectronic components.

The at least one further group of optoelectronic components, for example D11, can have, for example, a greater probability of being operated at a lower voltage or can have no dependency with respect to optoelectronic properties on the input voltage, than the group of optoelectronic components, for example D41 to D48, at a relatively high voltage.

In one configuration, two different designs of optoelectronic components can be used for the optoelectronic components D11, D21, D22, D31-D34, D41-D48, for example a warm-white-emitting LED or a cold-white-emitting LED.

In one configuration, the optoelectronic components of the first group D11 and the optoelectronic components of the second group D21, D22 can provide, for example, warm white light.

The optoelectronic components of the third group D31-D34 can have, for example, optoelectronic components, of which approximately half provide warm white light and approximately half provide cold white light.

The optoelectronic components of the fourth group D41-D48 can have, for example, optoelectronic components which provide cold white light.

Figure 6:
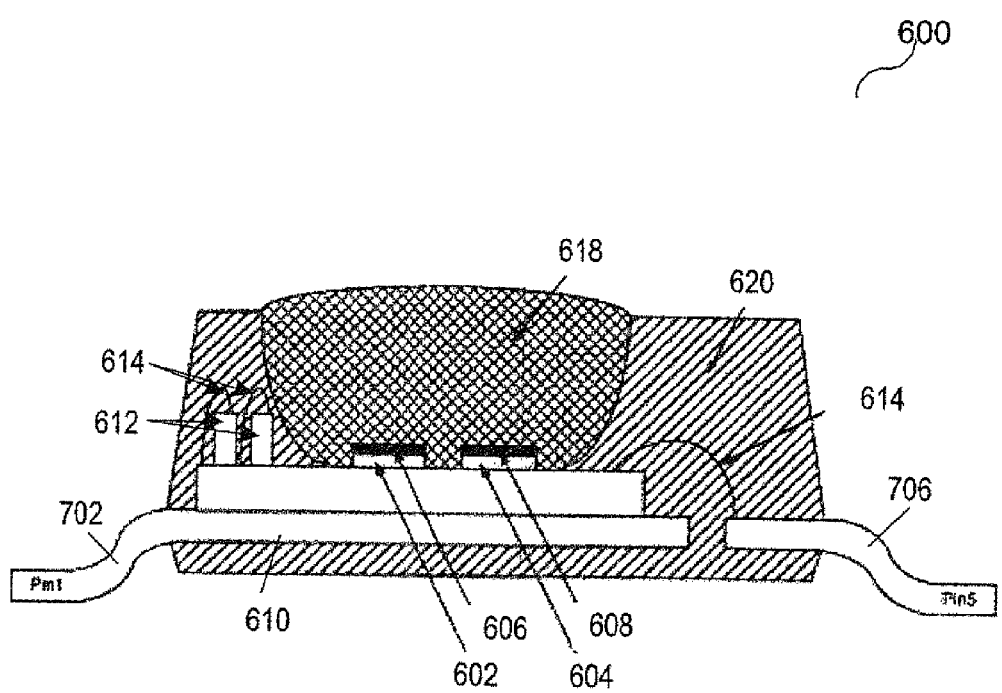
FIG. 6 shows a specific configuration of an optoelectronic component device, in accordance with various configurations.

FIG. 6 shows a specific configuration of an optoelectronic component device, in accordance with various configurations.

What is illustrated is a schematic cross-sectional view of part of an optoelectronic component device, in accordance with various configurations.

Groups of optoelectronic components can be seen in the cross-sectional view. The groups of optoelectronic components can have optoelectronic components which provide blue light, for example, and/or a wavelength converter, for example a phosphor layer. The wavelength converter can be formed in the beam path of the electromagnetic radiation provided on or over the optoelectronic component.

In the schematic cross-sectional view of the package 600, a first wavelength converter 606 on or over a first optoelectronic component 602, a second wavelength converter 608 on or over a second optoelectronic component 604 are illustrated, wherein the optoelectronic components 602, 604 are applied on or over a substrate 610, for example a chip carrier 610.

The color valence of the electromagnetic radiation which is provided by the first group of optoelectronic components 602 can have a different color valence, for example color temperature, than the electromagnetic radiation which is provided by the second group of optoelectronic components 604.

The wavelength converter, for example a phosphor layer, on or over the optoelectronic component can be printed onto the optoelectronic component, for example, and/or applied, for example placed, as ceramic platelet on or over the optoelectronic components.

The substrate can have, for example, electrically different conductive regions, for example which can be designed as different electrodes for contact guidance of the optoelectronic components.

In one configuration, the optoelectronic components 602, 604 can be, for example, part of the same and/or different group of optoelectronic components.

Furthermore, devices for storing electrical energy 612 can be arranged on the substrate 610 and/or in the substrate 610, for example can be integrated in and/or applied to the substrate 610, for example capacitors 612 can be formed on or over the substrate 610.

The substrate 610 can be arranged, for example, on or over at least part of a leadframe 702, 706, for example established in the electrical and/or physical, for example cohesive, contact.

In various embodiments, a leadframe 702, 706 can be understood to mean, for example, a metal structure which has one or more metal pieces, for example which holds the metal pieces together by a metal frame.

In various embodiments, a leadframe 702, 706 can be formed, for example, from a flat metal plate, for example by means of a chemical method such as etching, for example, or by means of a mechanical method such as stamping, for example.

In various embodiments, a leadframe 702, 706 can have, for example, a metal frame, which has a multiplicity of metal pieces which later form electrodes and which can be connected to one another and to the metal frame by means of metal webs.

In various embodiments, a leadframe 702, 706 can also be understood as the metal pieces which are formed from an above-described metal frame and which form electrodes, however, wherein the metal pieces are no longer physically connected to one another by means of the metal, i.e. for example once the metal webs have already been removed. Therefore, the electrodes apparently form, in various embodiments, the leadframe itself or can represent individual parts of a leadframe.

The different electrical and/or electronic components 610, 612 of the component device can be connected to the substrate 610 and/or the leadframe 702, 706 by means of wires 614.

Furthermore, the optoelectronic component device can have a potting material 620, for example a housing 620.

The potting material 620 can have or be formed from a plastic, for example.

The potting material can, as substance, have or be formed from a substance from the group consisting of the following substances: polyolefins (for example polyethylene (PE) with a high or low density or polypropylene (PP)), polyvinyl chloride (PVC), polystyrene (PS), polyester, polycarbonate (PC), polyethylene terephthalate (PET), polyethersulfone (PES), polyethylene naphthalate (PEN), polymethyl methacrylate (PMMA), polyimide (PI), polyether ether ketones (PEEK), an epoxy, a silazane, a silicone.

The potting material 620 can be designed for mechanically stabilizing the optoelectronic component device.

In one configuration, at least part of the leadframe 702, 706 can be passed out of the housing 620 and/or the package 620, for example for conversion purposes. Those parts of the leadframe 702, 706 which have been passed out can be referred to as pin (illustrated: pin 1 (702) and pin 5 (706)—see, for example, also FIG. 7), for example.

The passed-out parts of the leadframe 702, 706 can be designed, for example, for making electrical contact with the groups of optoelectronic components 602, 604.

Furthermore, the optoelectronic component device can have an optical component 622, for example an optical lens 622. The optical lens 622 can be arranged, for example, in the optical path of the optoelectronic components, for example can have been formed by means of volume potting, for example.

The optical lens 622 can include, for example, a silicone, a silazane and/or an epoxy or be formed therefrom.

The switch circuits 408-1, 408-2, 408-3, 408-n for the optoelectronic components can be formed on or in the substrate 610, for example (not illustrated).

Instead of different wavelength converters 606, 608, for example different phosphor layers 606, 608 on the different groups of optoelectronic components 602, 604, the same substance and/or the same substance mixture with the same phosphor can be used for both groups of optoelectronic components 602, 604.

In order to change the correlated color temperature, for example, the optical path through the phosphor layer 606, 608 can be designed differently for different groups of optoelectronic components.

In other words, the substance or the substance mixture of the groups of optoelectronic components can be similar or equivalent and the different color locus can be formed by means of different layer thicknesses of the phosphor layer.

In one configuration, a series of groups of optoelectronic components 602, 604 can be applied and/or formed on or over the substrate 610 and a phosphor layer 606, 608 can be applied thereon or thereover by means of screen printing. The phosphor layers 606, 608 can have a different layer thickness with respect to the flat surface of the substrate 610 and the optoelectronic components 602, 604.

The layer thickness gradient of the phosphor layer 606, 608 can be selected such that the average layer thickness of the phosphor layer 606, 608 on groups of optoelectronic components which have a relatively high correlated color temperature is lower than on groups of optoelectronic components which are intended to have a relatively low color temperature.

Instead of screen printing of the phosphor layer on or over the substrate, the phosphor layer can be dispensed, for example dispensed irregularly, and/or the phosphor layer can be applied by means of volume potting.

Figure 7:
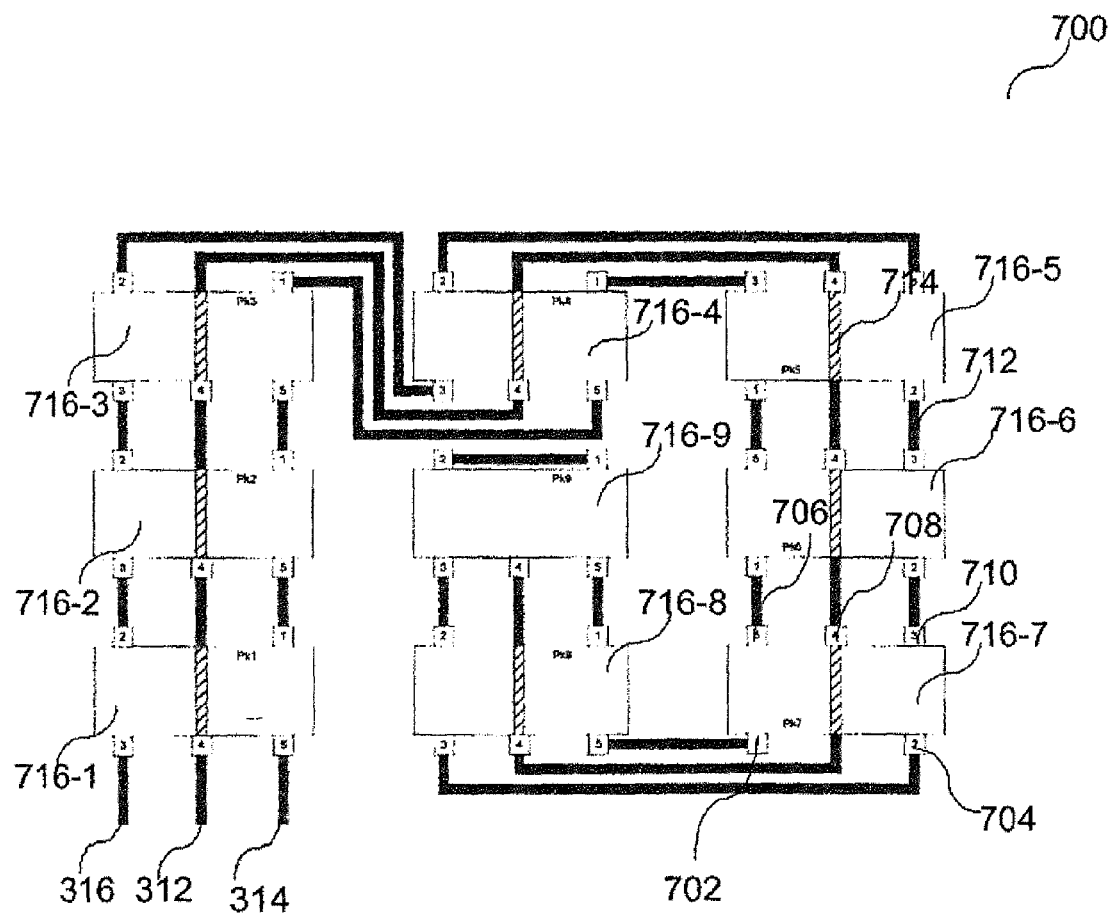
FIG. 7 shows a specific configuration of an optoelectronic component device, in accordance with various configurations.

FIG. 7 shows a specific configuration of an optoelectronic component device, in accordance with various configurations.

FIG. 7 shows a printed circuit board which can be understood to mean a specific configuration of an optoelectronic component device, wherein both ends of the LED chains are arranged tightly close to one another.

On each of the 9 package positions 716-1, 716-2, 716-3, 716-4, 716-5, 716-6, 716-7, 716-8, 716-9 illustrated by way of example, electrical contact can be made by means of pins between a package 600 and at least one group of optoelectronic components (two groups 602, 604, illustrated), for example, with wiring similar to or equivalent to one of the configurations from the description relating to FIG. 6, for example.

The pin 2 and the pin 3 can be designed as contacts of a first group of optoelectronic components.

The pin 1 and the pin 5 can be designed as contacts of a second group of optoelectronic components.

The pins 2, 3 and 1, 5 can be designed for the serial energization of the different packages 716-1, 716-2, 716-3, 716-4, 716-5, 716-6, 716-7, 716-8, 716-9.

The pin 4 can be designed as a common connection 312 of the controller circuit.

The above described components of the circuit for operating an optoelectronic component device, for example the switch circuit 426-1, 426-2, 426-3, 426-n can be formed, for example, in the respective package 716-1, 716-2, 716-3, 716-4, 716-5, 716-6, 716-7, 716-8, 716-9.

The rectifier 404 and the voltage source 402 are not illustrated in the view 500 and can be realized, for example, on a further circuit board, not illustrated.

As illustrated, the series circuit including groups of optoelectronic components 410-1, 410-2, 410-3, 410-n can be realized by means of electrically coupling the pin 1 of a first package to the pin 5 of a second package and electrically coupling the pin 2 of a first package to the pin 3 of a second package.

The arrangement illustrated can have the advantage that the printed circuit board can be printed on one side since the electrical conductor tracks 712 do not intersect one another and/or the electrical conductor tracks pass invisibly 714 beneath the packages of the groups of optoelectronic components.

Figure 8:
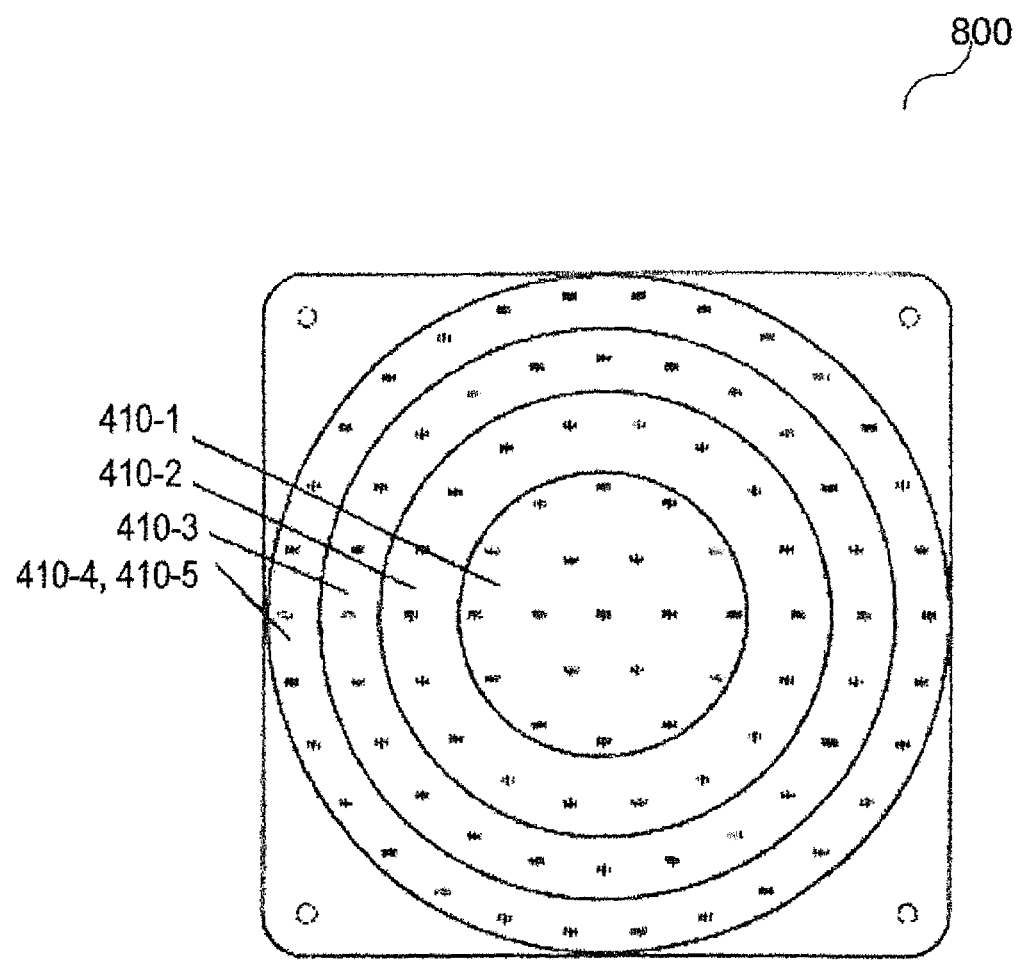
FIG. 8 shows a specific configuration of a dimmable optoelectronic component device, in accordance with various configurations.

FIG. 8 shows a specific configuration of a dimmable optoelectronic component device, in accordance with various configurations.

The view 800 illustrates a plan view of part of an optoelectronic component device, in accordance with one configuration from the descriptions relating to FIG. 1 to FIG. 7.

In one configuration of the optoelectronic component device, the groups of optoelectronic components 410-1, 410-2, 410-3, 410-4, 410-5 can be designed in such a way that, for example, in a similar or equivalent manner to a configuration of the description relating to FIG. 4, in sum a homogeneous light image, for example homogeneous radiation field of the electromagnetic radiation provided is achieved.

In one configuration, the groups of optoelectronic components having a second color valence, for example a high correlated color temperature, can at least partially surround or surround, concentrically, at least one group of optoelectronic components having a first color valence, for example a relatively low correlated color temperature.

The fifth group of optoelectronic components 410-5 with the shortest ON time can provide, for example, electromagnetic radiation with the highest color temperature.

During dimming, the fifth group of optoelectronic components 410-5 can be the first to be extinguished, i.e. no longer energized.

Then, the fourth group of optoelectronic components 410-4 with the lower correlated color temperature can follow.

As the degree of dimming increases, the extinguishing, i.e. the state in which no electromagnetic radiation is provided any more, can be continued until the first group of optoelectronic components 410-1 is extinguished.

In other words: in the concentric arrangement of groups of optoelectronic components, serial extinguishing of the groups can take place from the outside inwards.

In a further configuration, the group of optoelectronic components with the highest correlated color temperature can be surrounded by groups of optoelectronic components with a lower temperature.

In other words: the groups of optoelectronic components with different temperatures can be arranged concentrically with respect to one another in such a way that the color valence of electromagnetic radiation provided, i.e. the color locus, for example the color temperature, increases from the inside outwards, increases from the outside inwards or is arranged alternately, for example.

The concentric arrangement can have, for example, a shape similar to or equivalent to one of the following geometric shapes: a square, a rectangle, a triangle, a circle, an ellipse, a quadrilateral, a meandering arrangement or the like.

If more than two groups of optoelectronic components are required for the optoelectronic component device, said groups can be formed alternately, for example, within a segment, i.e. within a ring, as is illustrated by means of the fourth group 410-4 and fifth group 410-5 in the view 800 by way of example.

In various embodiments, an optoelectronic component device is provided with which it is possible, by means of very little complexity in terms of circuitry to form electromagnetic radiation provided with different color valence, for example correlated color temperature, using only one chain of groups of optoelectronic components during dimming.

In the optoelectronic component device, the optoelectronic components can be arranged in such a way that the optoelectronic components which provide the electromagnetic radiation with a high correlation color temperature are surrounded, for example concentrically, by optoelectronic components whose electromagnetic radiation provided has a lower correlated color temperature. As a result, in order to form color mixing, less diffuser material and a smaller diffuser thickness can be required in comparison with a conventional optoelectronic component device.

The optical losses can be at a lower level, as a result of which the efficiency of the light source can be increased. Furthermore, fewer electrical components, fewer electronic components and/or less complexity in terms of circuitry may be required in order to form an optoelectronic component device, for example an LED light, with varying correlated color temperature.

Furthermore, the optoelectronic component device can have the advantage that the optoelectronic components, for example LEDs, with a low correlated color temperature and therefore lower efficiency are switched on for longer and therefore the impression of the total luminance appears to be homogeneous.

Furthermore, the optoelectronic components, for example LEDs, with a low correlated color temperature can also already provide electromagnetic radiation while the input voltage at the optoelectronic components is still increasing. At relatively low voltages, the optoelectronic components can provide electromagnetic radiation more efficiently. As a result, the efficiency and life of the optoelectronic component device can be improved.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component device, comprising:
 a first group of optoelectronic components comprising at least one first optoelectronic component, wherein the at least one first optoelectronic component is designed to provide electromagnetic radiation of a first color valence;
 a second group of optoelectronic components comprising at least one second optoelectronic component, wherein the at least one second optoelectronic component is designed to provide electromagnetic radiation of a second color valence; and
 a phase dimmer,
  wherein the phase dimmer is designed such that a first operating mode with a first degree of dimming and a second operating mode with a second degree of dimming are provided,
  wherein the phase dimmer actuates the first group of optoelectronic components and the second group of optoelectronic components such that, in the first operating mode, a first array of optoelectronic components of the optoelectronic component device is energized and, in the second operating mode, a second array of optoelectronic components of the optoelectronic component device is energized;
  wherein, with respect to the total intensity of the electromagnetic radiation provided of the optoelectronic component device, the proportion of electromagnetic radiation of the first color valence is less in the first operating mode than in the second operating mode and the proportion of the electromagnetic radiation of the second color valence is greater in the first operating mode than in the second operating mode.

2. The optoelectronic component device as claimed in claim 1,
 wherein the phase dimmer is designed for the phase gating control and/or phase chopping control of the optoelectronic components.

3. The optoelectronic component device as claimed in claim 1,
 wherein the first group of optoelectronic components has at least one optoelectronic component more or fewer than the second group of optoelectronic components.

4. The optoelectronic component device as claimed in claim 1,
 wherein the first group of optoelectronic components is connected electrically upstream of the second group of optoelectronic components.

5. The optoelectronic component device as claimed in claim 1,
wherein the first group of optoelectronic components and/or the second group of optoelectronic components has a series circuit, a parallel circuit and/or a combination of a series circuit and a parallel circuit of optoelectronic components.

6. The optoelectronic component device as claimed in claim 1,
wherein the optoelectronic component device is designed in such a way that the second optoelectronic components surround the first optoelectronic components at least partially in their arrangement.

7. The optoelectronic component device as claimed in claim 1,
wherein the energized array of optoelectronic components of the optoelectronic component device is smaller in the second operating mode than in the first operating mode.

8. The optoelectronic component device as claimed in claim 1,
wherein the first color valence has a different color locus than the second color valence.

9. The optoelectronic component device as claimed in claim 8,
wherein the first color valence has a higher correlated color temperature than the second color valence.

10. The optoelectronic component device as claimed in claim 8,
wherein the first color valence has a lower correlated color temperature than the second color valence.

11. The optoelectronic component device as claimed in claim 1,
further comprising at least one third group of optoelectronic components.

12. The optoelectronic component device as claimed in claim 11,
wherein the at least one optoelectronic component of the third group of optoelectronic components has different optoelectronic properties with respect to the optoelectronic component of the first group of optoelectronic components and/or the second group of optoelectronic components.

13. The optoelectronic component device as claimed in claim 12,
wherein the third group of optoelectronic components provides electromagnetic radiation with a third color valence.

14. The optoelectronic component device as claimed in claim 13,
wherein the third color valence has a correlated color temperature whose value is formed between the first color valence and the second color valence.

15. The optoelectronic component device as claimed in claim 1,
designed as a dimmable light, wherein the color valence of the electromagnetic radiation provided is changed over during dimming from the first color valence to the second color valence.

* * * * *